(12) United States Patent
Arpilliere et al.

(10) Patent No.: US 7,723,869 B2
(45) Date of Patent: May 25, 2010

(54) DEVICE FOR CONTROLLING A POWER ELECTRONIC SWITCH AND SPEED CONTROLLER COMPRISING SAME

(75) Inventors: Michel Arpilliere, Poissy (FR); Philippe Baudesson, La Boissiere (FR); Hocine Boulharts, Triel sur Seine (FR); Philippe Loizelet, Le Plessis Hebert (FR)

(73) Assignee: Schneider Toshiba Inverter Europe SAS, Pacy-sur-Eure (FR)

( * ) Notice: Subject to any disclaimer, the term of this patent is extended or adjusted under 35 U.S.C. 154(b) by 176 days.

(21) Appl. No.: 12/018,584

(22) Filed: Jan. 23, 2008

(65) Prior Publication Data

US 2008/0174184 A1 Jul. 24, 2008

(30) Foreign Application Priority Data

Jan. 23, 2007 (FR) ................................. 07 52840

(51) Int. Cl.
*H01H 35/00* (2006.01)
*H01H 83/00* (2006.01)
(52) U.S. Cl. ..................................... 307/116
(58) Field of Classification Search ................. 307/116, 307/125
See application file for complete search history.

(56) References Cited

U.S. PATENT DOCUMENTS

2003/0179021 A1 9/2003 Braun et al.

2004/0004404 A1 1/2004 Eckardt et al.

FOREIGN PATENT DOCUMENTS

WO WO 2007/137569 A1 12/2007

OTHER PUBLICATIONS

Daniel Domes, et al., "A New, Universal and Fast Switching Gate-Drive-Concept for SiC-JFETs Based on Current Source Principle", 2006 IEEE Power Electronics Specialists Conference 18-22, XP 002450191, Jun. 22, 2006, 6 Pages (with corresponding WO 2007/137569).
"MEMs for Improved Power Management", IP.COM Journal, XP 013023381, Feb. 22, 2005, 2 Pages.

*Primary Examiner*—Fritz M Fleming
*Assistant Examiner*—Carlos Amaya
(74) *Attorney, Agent, or Firm*—Oblon, Spivak, McClelland, Maier & Neustadt, L.L.P.

(57) ABSTRACT

A device controlling a JFET power electronic switch of normally ON type, including a main gate control circuit powered by a main power source for driving the gate of the JFET switch, a protection switching device that is switchable between two states, an auxiliary circuit controlling the switching device, and an auxiliary power source whose positive terminal is connected to the source of the JFET switch and whose negative terminal is connected to the gate of the JFET switch, bypassing the gate control circuit in one of the two positions of the switching device. The switching device can be an electromagnetic or electronic switch.

18 Claims, 3 Drawing Sheets

DEVICE FOR CONTROLLING A POWER ELECTRONIC SWITCH AND SPEED CONTROLLER COMPRISING SAME

FIELD OF THE INVENTION

The present invention relates to a device for controlling a power electronic switch of the JFET transistor (Junction Field Effect Transistor) type formed, for example, from silicon carbide (SiC). The invention proposes the use of JFET transistors of the normally ON type for the switching of high-power currents and, in particular, as power switches in an inverter stage of a speed controller.

DISCUSSION OF THE BACKGROUND

A JFET transistor is a known electronic switch that comprises a control gate whose function is to allow or disallow a current to flow between a drain and a source. Such a transistor is of the normally ON type if the voltage $V_{DS}$ between the Drain and the source is zero when the voltage $V_{GS}$ between the gate and the source is zero. This implies that the drain-source path is conducting or ON in the absence of a control voltage $V_{GS}$ between gate and source. Conversely, a JFET transistor is of the normally OFF type if the drain-source path is not conducting in the absence of a control voltage $V_{GS}$ between gate and source.

It turns out that a JFET electronic switch of the normally ON type offers much better performance than other types of electronic switches, such as MOSFETs, IGBTs or even JFETs of the normally OFF type. The reason for this is that such a switch offers, notably, the advantages of higher switching speed, lower losses in the conducting state, a better temperature stability, a smaller size and a lower cost.

Nevertheless, any electronic switch of the normally ON type has the drawback of being in the conducting state (or ON) in the absence of a control voltage on its gate. This feature is not fail-safe for the control of large currents since this switch allows the current to flow between drain and source in the absence of control on the gate. This clearly leads to high potential risks for the safety of equipment and people.

Usually, a speed controller of the frequency converter type comprises a rectifier stage responsible for rectifying a voltage coming from an external source of AC electrical power (for example a 380 VAC three-phase electrical supply network) in order to supply a DC voltage onto a DC bus (for example of around 400 to 800 Vcc, or more, depending on the conditions of use). One or more bus capacitors of high capacitance are typically used in order to keep the voltage on the DC bus constant.

The speed controller next comprises an inverter stage responsible for controlling an electric motor with a voltage of variable amplitude and frequency, starting from this DC bus. For this purpose, the inverter stage has two electronic power switches per phase. Each switch is controlled by a control circuit powered by a power supply of the SMPS (Switched-Mode Power Supply) type for the speed controller.

Thus, if it is desired to use electronic switches of the normally ON type in the inverter stage of a speed controller, this may then present several risks:

On power-up of the controller, it must be ensured that the circuits for controlling the electronic switches are correctly supplied with power, in order to be able to open these switches before the voltage appears on the DC bus of the speed controller, On power-down, it must be ensured that the electronic switches are kept open until the bus capacitor or capacitors are discharged, for example into balancing resistors, being aware that the discharging of these capacitors can sometimes last for up to several minutes, If a fault occurs, it must also be ensured that the switches are kept open until the capacitor or capacitors of the DC bus are discharged. Such a fault can arise notably from a short-circuit in the control circuit, from a loss of power to the control circuit, etc.

In order to avoid these risks, a solution already exists in which each JFET transistor of the normally ON type is configured in series with another auxiliary component of the normally OFF type, such as for example a CASCODE transistor. This solution however requires the use of two transistors in series for each power switch, which notably leads to an increase in the production costs and an increase in the losses by conduction.

SUMMARY OF THE INVENTION

The object of the invention is therefore to be able to use normally ON JFET transistors as power switches in an inverter stage of a speed controller and, thanks to a control device capable of avoiding the abovementioned drawbacks, namely to provide a simple solution allowing the risks encountered at power-up/power-down and when faults occur to be avoided.

For this purpose, the invention describes a device for controlling a JFET power electronic switch of the normally ON type, the control device comprising a main gate control circuit powered by a main power source for driving the gate of the JFET switch. The control device comprises a protection switching device that is switchable between two positions, an auxiliary control circuit driving the protection switching device, and an auxiliary power source supplied by the said main power source. The negative terminal of the auxiliary power source is connected to the gate of the JFET switch, bypassing the main gate control circuit in one of the two positions of the protection switching device, and the positive terminal of the auxiliary power source is connected to the source of the JFET switch.

According to one feature, the protection switching device comprises an electromagnetic switch having a contact mobile between two positions by the action of a control solenoid of the auxiliary control circuit, the said mobile contact being switchable between a first position in which the gate of the JFET switch is connected to the main gate control circuit and a second position in which the gate of the JFET switch is connected to the negative terminal of the auxiliary power source. In the absence of power to the control solenoid, the mobile contact is held in the second position.

According to another feature, the protection switching device comprises a first electronic switch which is placed between the gate of the JFET switch and the negative terminal of the auxiliary power source, and which is driven by the auxiliary control circuit between a first non-conducting state in which the gate of the JFET switch is not connected to the negative terminal of the auxiliary power source and a second conducting state in which the gate of the JFET switch is connected to the negative terminal of the auxiliary power source.

BRIEF DESCRIPTION OF THE DRAWINGS

Other features and advantages will become apparent in the detailed description that follows by referring to one embodiment presented by way of example and shown by the appended drawings, in which.

DESCRIPTION OF THE PREFERRED EMBODIMENTS

Figure 1:
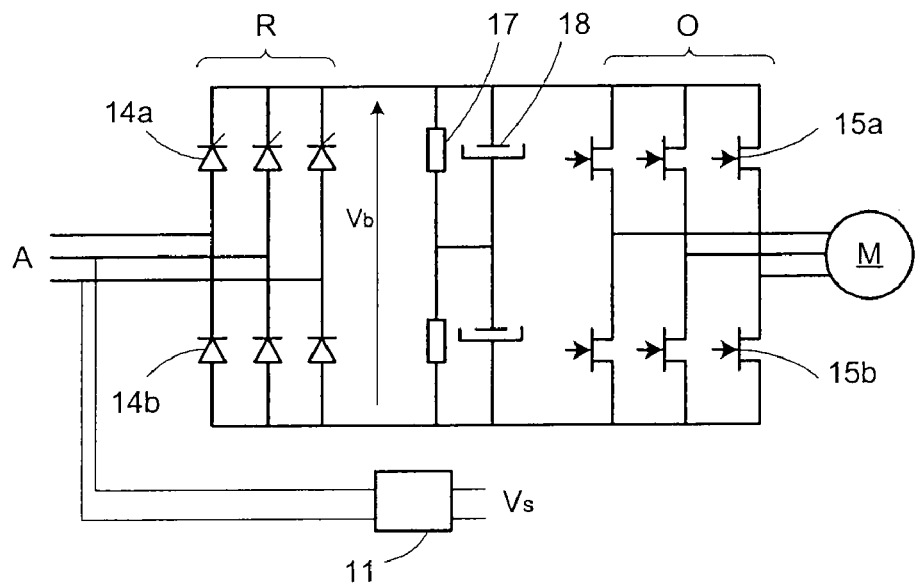
FIG. 1 shows a simplified conventional architecture of a speed controller using several JFET power switches, FIG. 2 describes a known device for controlling a JFET power switch of the normally ON type.

With reference to FIG. 1, a speed controller comprises a rectifier stage R responsible for rectifying a three-phase AC voltage coming from an external power supply network A, with the object of supplying a DC bus voltage Vb. For this purpose, the rectifier stage R comprises two power electronic components 14a,14b per phase. These components 14a,14b are for example diodes and/or thyristors. The example in FIG. 1 has a thyristor 14a coupled with a diode 14b for each phase of the supply network A. In order to maintain the voltage Vb on the DC bus constant, the controller shown in FIG. 1 comprises two bus capacitors 18 coupled to two balancing resistors 17 which allow the voltage between these two capacitors to be balanced.

The speed controller next comprises an inverter stage 0 allowing an electric motor M to be controlled, from the DC bus Vb, with a voltage of variable amplitude and frequency, by means of a control using PWM (Pulse-Width Modulation). For this purpose, the inverter stage has two power electronic switches 15a,15b per phase. Each switch 15a,15b is a JFET transistor (Junction Field-Effect Transistor) of the normally ON type (in other words in the conducting state in the absence of voltage on the gate of the transistor) which is made of silicon carbide (SiC). Materials other than silicon carbide could also be used, which could be any wide-band gap material, in other words exhibiting a low resistance in the conducting state $R_{dson}$ and capable of withstanding high voltages (higher than 1000 V), such as for example gallium nitride (GaN).

These control devices are powered by an SMPS (Switched-Mode Power Supply) 11 for the speed controller, which supplies a DC voltage Vs starting from the supply network A. The voltage Vs is notably used to power the control unit for the speed controller (not shown in FIG. 1), the devices for controlling the JFET transistors 15a,15b, together with the devices for controlling the thyristors 14a of the rectifier stage.

Because power switches 15a,15b of the normally ON type are used, it must clearly be ensured that the devices controlling these switches 15a,15b are correctly powered before the appearance of the bus voltage Vb, in order to avoid a short-circuit in the inverter stage O of the speed controller and/or spurious currents in the motor M. It must therefore be ensured that the switched-mode power supply 11 supplies the voltage Vs before the appearance of the bus voltage Vb.

A first solution described in FIG. 1 consists in powering the switched-mode power supply 11 directly from the external AC network A and in using, in the rectifier stage R, thyristors 14a whose control devices are powered by the switched-mode power supply 11. Thus, as long as the voltage Vs is not present, the thyristors 14a are not controlled and the bus voltage Vb does not appear.

Another solution consists, for example, in powering the switched-mode power supply 11 directly from the external AC network A, upstream of a line contactor (not shown) present at the input of the speed controller. The solenoid of this line contactor is controlled using the voltage Vs. Thus, as long as the voltage Vs is not present, the line contactor is open. The rectifier stage R of the controller is not yet powered and the bus voltage Vb does not appear. In this solution, the rectifier stage R may only comprise diodes 14a,14b.

Figure 2:
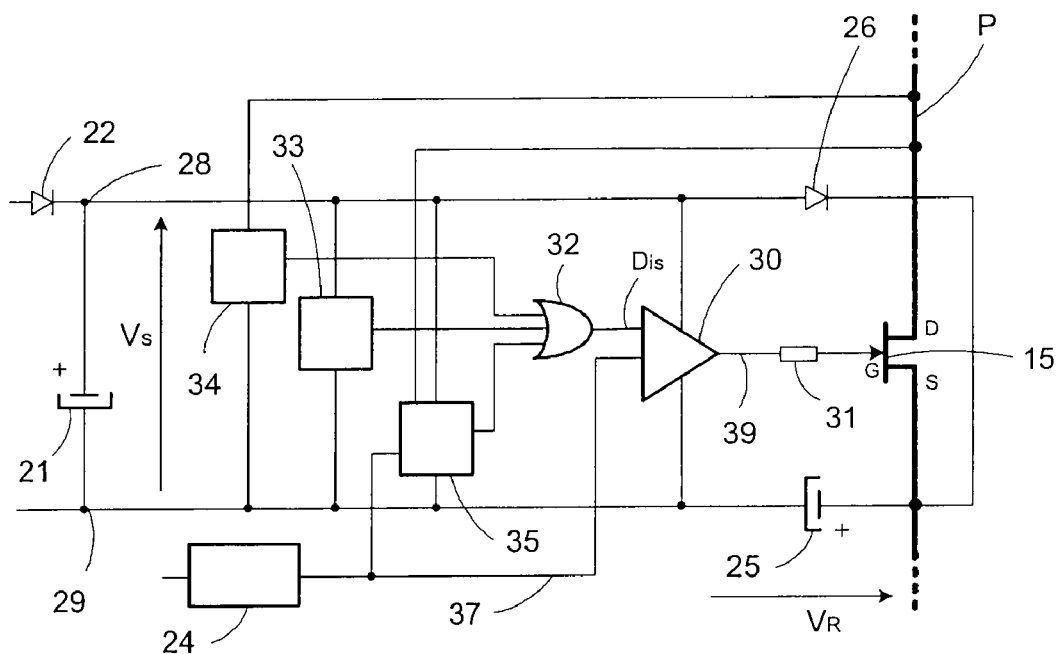

FIG. 2 shows an existing device for controlling a power electronic switch 15 of the normally ON JFET transistor type, formed for example from SiC. Such a JFET transistor 15 is controlled by applying a negative voltage $V_{GS}$ between the gate G and the source S. In the absence of voltage $V_{GS}$ between Gate G and Source S or in the presence of a positive voltage $V_{GS}$, the transistor 15 is conducting between the drain D and the source S, in other words the voltage $V_{DS}$ is zero. In order to turn off the transistor 15 (in other words voltage $V_{DS}$ maximum), a sufficiently high negative voltage $V_{GS}$ must be applied, for example of around −15 Volts.

The control device comprises a main gate control circuit 30 (also referred to as gate driver) which is a power amplifier circuit allowing the gate G to be controlled with a control signal 37. In a known manner, this main gate control circuit 30 can be of the "Push-Pull", "Reversed Push-Pull" or "Totem Pole" type and formed with bipolar transistors or with MOSFET transistors. The output 39 of the main gate control circuit 30 is connected to the gate G of the JFET transistor 15 via a resistor 31. The control signal 37 of the transistor 15 comes for example from a control unit 24 of the speed controller.

Depending on the desired functionalities, the control device in FIG. 2 also comprises one or more fault detection modules 33,34,35, whose purpose is to maintain the transistor 15 in the OFF state in the case of the occurrence of one of these faults. When several fault detection modules are present, the outputs of these detection modules 33,34,35 form the inputs of an OR logic gate 32, whose output provides a disable input $D_{IS}$ to the main gate control circuit 30. When this input $D_{IS}$ is in the 1 state, this means that the gate control circuit 30 must force the transistor 15 into the OFF state (whatever the state of the control signal C) and therefore supply a negative voltage $V_{GS}$ (of around −15 V) onto the gate G.

A first under-voltage detection module 33 is used to detect the occurrence of a drop in the voltage Vs from the power supply 11 below a pre-determined threshold. This voltage drop may notably come from either the shutdown of the speed controller, or from a fault or short-circuit in the power supply 11, in the buffer capacitor 21 or in the gate control circuit 30.

A second short-circuit detection module 35 is used to detect the occurrence of a short-circuit in the JFET transistor 15. The short-circuit detection module 35 compares the control signal 37 with the true voltage across the terminals of the JFET transistor 15 in order to detect a possible short-circuit.

A third over-voltage detection module 34 is used to detect the occurrence of an over-voltage across the terminals of the JFET transistor 15. This over-voltage may for example occur when trying to turn off the JFET transistor 15 while there is a short-circuit on the power line P of the JFET transistor 15.

The control device is powered by a main power source delivering a main voltage Vs between the positive terminal 28 and negative terminal 29. In the case of a speed controller, this main power source preferably comes from the switched-mode power supply 11, associated with a rectifier diode 22 and a main capacitor 21 serving as an energy buffer for the voltage Vs.

The control device is powered by a main power source delivering a main voltage Vs between the positive terminal 28 and negative terminal 29. In the case of a speed controller, this main power source preferably comes from the switched-mode power supply 11, associated with a rectifier diode 22 and a main capacitor 21 serving as an energy buffer for the voltage Vs.

The purpose of this charging diode 26 is to avoid the auxiliary capacitor 25 discharging into all the elements placed in parallel with the main capacitor 21, such as the elements 33, 35, 30, when the voltage Vs is lower than the voltage $V_R$ across the terminals of the auxiliary capacitor 25. It is placed downstream of the circuit nearest to the JFET transistor 15 (in this case, the circuit 30 in the figures), in other words between the auxiliary capacitor 25 and the connections of the circuit 30. Its cathode is directed towards the positive terminal of the auxiliary capacitor 25 and its anode is directed towards the positive terminal 28. The charging diode 26 could also have been disposed between the negative terminals of the capacitors 21, 25, its cathode then being connected to the negative terminal of the auxiliary capacitor 25 and its anode connected to the negative terminal 29.

When the voltage Vs appears, the auxiliary capacitor 25 is automatically charged up, because the charging diode 26 conducts as long as the voltage $V_R$ is lower than the voltage Vs. When the voltage Vs falls and becomes less than the voltage $V_R$, the auxiliary capacitor 25 provides a reserve supply of voltage in order to power the gate control circuit 30, whose output 39 must supply a negative voltage $V_{GS}$. The size of the auxiliary capacitor 25 must be calculated in order to obtain a negative voltage $V_{GS}$ that is capable of maintaining the JFET transistor 15 in the OFF state for a period of time T that is long enough to ensure that the bus capacitors of the controller are completely discharged (for example, of the order of 10 minutes). The reason for this is that, as long as the bus capacitors are not discharged, the JFET transistor 15 must not return to the conducting ON state for reasons of safety.

Since the gate control circuit 30 (gate driver) consumes power and generates leakage currents which may be significant (for example, greater than 1 mA), the auxiliary capacitor 25 is therefore going to be discharged fairly quickly into the circuit 30. A very large auxiliary capacitor 25 is then required in order to be able to provide a sufficient supply of energy to turn off the JFET transistor 15 for the whole period T. This therefore leads to problems of feasibility, cost and size, in particular for a three-phase speed controller comprising six separate JFET transistors 15 in its inverter stage.

For this reason, one of the objects of the invention is to design a control device allowing the losses to be minimized when the auxiliary capacitor 25 has to supply the voltage $V_{GS}$ in order to maintain the JFET transistor 15 in the OFF state over the period T. For this purpose, the invention proposes the addition of a protection switching device to the control device. This switching device is switchable between two positions and is configured such that, in one of these two positions, the negative terminal of the auxiliary capacitor 25 is connected to the gate G of the transistor 15 thus bypassing the gate control circuit 30, in such a manner that, in this position, the auxiliary capacitor 25 supplies the gate 30 of the normally ON JFET transistor 15 in order to maintain it in the OFF state and the auxiliary capacitor 25 cannot be discharged by other components.

Figure 3:
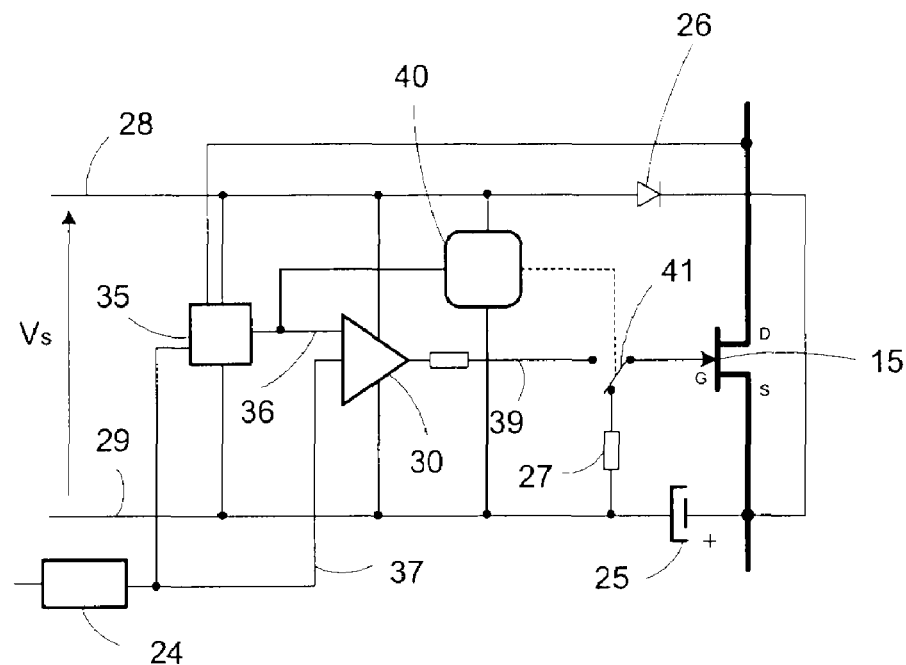
FIG. 3 shows a first embodiment of a device for controlling a JFET power switch according to the invention, FIG. 4 details one example of an auxiliary circuit for controlling the electromagnetic switch according to the first embodiment.
Figure 4:
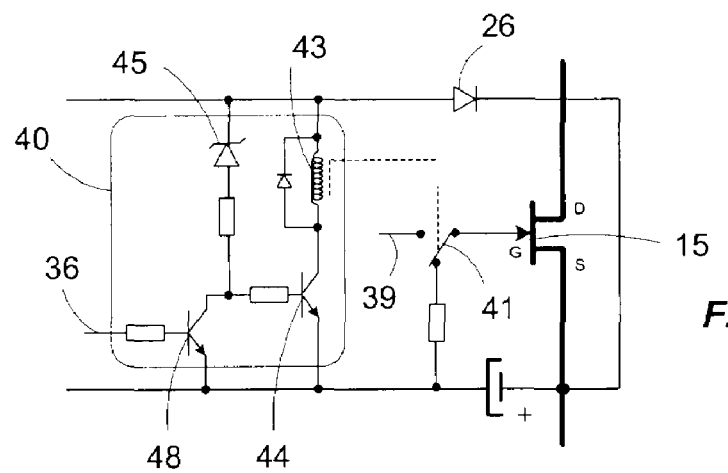
Figure 5:
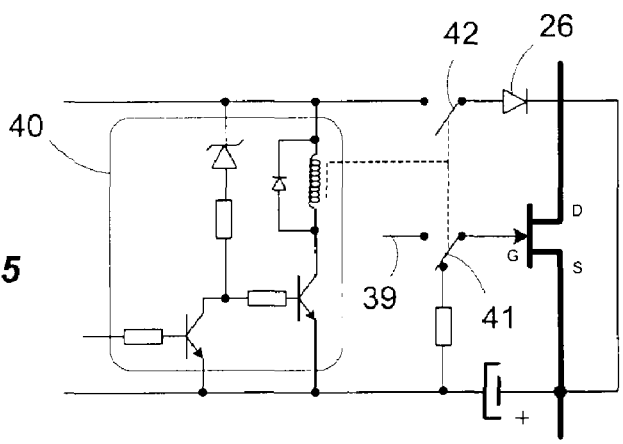
FIG. 5 presents a variant of the first embodiment.

According to a first embodiment of the invention shown in FIGS. 3 to 5, the protection switching device is an electromagnetic switch 41. In a second embodiment shown in FIGS. 6 to 8, the protection switching device is an electronic switch 51.

With reference to FIG. 3, the device for controlling a JFET switch is powered by a main power source delivering a main voltage Vs between the terminals 28 and 29. In a speed controller, this main power source is preferably the switched-mode power supply 11. The control device also comprises an auxiliary power source 25 which is charged by the voltage Vs through a charging diode 26, in an identical manner to the device in FIG. 2 described hereinabove.

As in FIG. 2, the control device comprises a main gate control circuit 30 (or gate driver) allowing the gate G to be controlled using the control signal 37 which comes, for example, from the control unit 24 of the speed controller. In FIG. 3, only one fault detection module is shown (in this case a module 35 for detecting short-circuits in the JFET transistor), the output 36 of this detection module being directly connected to the input $D_{IS}$ of the gate control circuit 30.

The output 39 of the main gate control circuit 30 is connected to the gate G of the JFET transistor 15 via a resistor 31. In contrast to FIG. 2, a protection switching device of the electromagnetic switch type is placed between the output 39 and the gate G.

This electromagnetic switch comprises a mobile contact 41 which is switchable between two positions by the action of an auxiliary control circuit 40.

In the first position of the mobile contact 41, the electromagnetic switch allows the gate G of the JFET transistor 15 to be connected to the output 39 of the gate control circuit 30. In the second position of the mobile contact 41, the electromagnetic switch isolates the gate G from the output 39 and connects the gate G to the negative terminal of the auxiliary reservoir capacitor 25, via an optional resistor 27. Thus, in this second position, the negative terminal of the auxiliary capacitor 25 is directly connected to the gate G bypassing the gate control circuit 30. The resistor 27 is preferably reasonably high so as to limit the variation in current dI/dt when the JFET transistor 15 is turned off and therefore to avoid possible over-voltages.

The electromagnetic switch is designed such that, in the absence of power to its control solenoid, the mobile contact 41 is always held in the second position, for example thanks to magnetic (permanent magnet) or elastic return means. Preferably, an electromagnetic switch of the MEMS (Micro Electro-Magnetic Switch) type is used whose power consumption, size and response time are very small and which does not generate a rebound.

One example of an auxiliary control circuit 40 is detailed in FIGS. 4 and 5, in which the gate control circuit 30 is not shown for the sake of simplification. The auxiliary control circuit 40 comprises a control solenoid 43 that actuates the mobile contact 41 of the electromagnetic switch. The first end of the solenoid 43 is connected to the positive terminal 28. The second end of the solenoid 43 is connected to the negative terminal 29 via a transistor 44. In the example in FIG. 4, the transistor 44 is an npn bipolar transistor whose Collector is connected to the second end of the solenoid 43 and whose Emitter is connected to the negative terminal 29. The Base of this bipolar transistor 44 is connected to the positive terminal 28 via a resistor and a device for detecting a minimum voltage threshold Vs, such as a Zener diode 45. In an equivalent manner, the auxiliary control circuit 40 could also be composed with field-effect transistors of the MOSFET type in place of bipolar transistors.

In normal operation, when the voltage Vs is present, the Zener diode 45 conducts, therefore the transistor 44 is turned on and a current flows in the control solenoid 43. The mobile contact 41 is then held in its first position which allows the gate G to be connected to the output 39 of the gate control circuit 30. The auxiliary capacitor 25 is charged up via the diode 26.

When the voltage Vs drops and goes below the minimum trigger threshold determined by the Zener diode 45, the latter no longer conducts and the transistor 44 is turned off. Since no current is then flowing in the control solenoid 43, the mobile contact 41 is automatically and rapidly returned into its second position (thanks to the return means) in which the gate G is connected to the negative terminal of the auxiliary capacitor 25.

Thus, when the mobile contact 41 of the electromagnetic switch is in the second position (as indicated in FIGS. 3 to 5), the source S of the JFET transistor 15 is connected to the positive terminal of the auxiliary capacitor 25 and the gate G of the JFET transistor 15 is connected to the negative terminal of the auxiliary capacitor 25 via the resistor 27. Therefore, advantageously, an auxiliary power supply circuit comprising only the JFET transistor 15, the auxiliary capacitor 25 and the resistor 27 is created. Furthermore, the diode 26 prevents the auxiliary capacitor 25 from discharging into the capacitor 21 and any other circuit connected in parallel with this main source, for as long as the voltage $V_R$ is higher than the voltage Vs.

The auxiliary capacitor 25 can no longer therefore discharge elsewhere other than into the JFET transistor in order to supply a negative voltage $V_{GS}$. And, it is known that a JFET transistor generates very little leakage current on its Gate-Source capacitance.

This simple solution thus allows all the losses of the auxiliary circuit to be significantly minimized, and therefore a much longer period T and/or a reduced size of the auxiliary capacitor 25 to be obtained. As soon as the voltage Vs falls below a threshold predetermined by the Zener diode 45, the gate G is isolated from the circuit 30 and the auxiliary power supply circuit for the JFET transistor 15 is created. The auxiliary control circuit 40 thus acts as a module for detecting an under-voltage of the voltage Vs.

Optionally, it is possible to also add a function for protection of the gate control circuit 30 when the JFET transistor 15 is in short-circuit. For this purpose, the auxiliary circuit 40 additionally comprises a second transistor 48 whose Collector is connected (via a resistor) to the Base of the transistor 44 and whose Emitter is connected to the negative terminal 29. The Base of the second transistor 48 is connected (via a resistor) to the output 36 of the module 35 for detecting a short-circuit of the JFET. Thus, when this module 35 detects a short-circuit, its output 36 goes to the 1 state which turns the transistor 48 on and turns the transistor 44 off. In this case, the solenoid 43 is no longer powered and the mobile contact 41 returns to its second position. Thus, the gate G is isolated from the gate control circuit 30 when a short-circuit of the JFET transistor 15 is detected. Another option might also consist in controlling the output of a module for detecting an over-voltage 34 in the auxiliary circuit 40.

FIG. 5 shows one variant of this first embodiment. In this variant, the electromagnetic switch additionally comprises a second mobile contact 42 which is controlled, like the first mobile contact 41, by the same control solenoid 43 and which is configured between the positive terminal 28 and the diode 26 in the following manner:

In normal operation (in other words when a current flows in the solenoid 43), the mobile contact 42 is in its first position and the positive terminal 28 is connected to the diode 26, as in FIG. 4.

In contrast, when no current flows in the solenoid 43, the mobile contact 42 is automatically returned to its second position which allows the positive terminal 28 to be isolated from the diode 26, and thus the auxiliary power source 25 to be disconnected from the main power source.

Thanks to this second mobile contact, the potential problem of leakage currents from the diode 26 when it is reverse biased are thus avoided, which accordingly lengthens the period of time T during which the auxiliary capacitor 25 can maintain the JFET transistor 15 in the OFF state. The main capacitor 21 is also prevented from discharging into the auxiliary capacitor 25 as a result of a possible short-circuit of the gate-source connections of the JFET transistor 15 when the latter dies in short-circuit. The fault in the JFET transistor is thus prevented from propagating into the gate control circuit 30.

Figure 6:
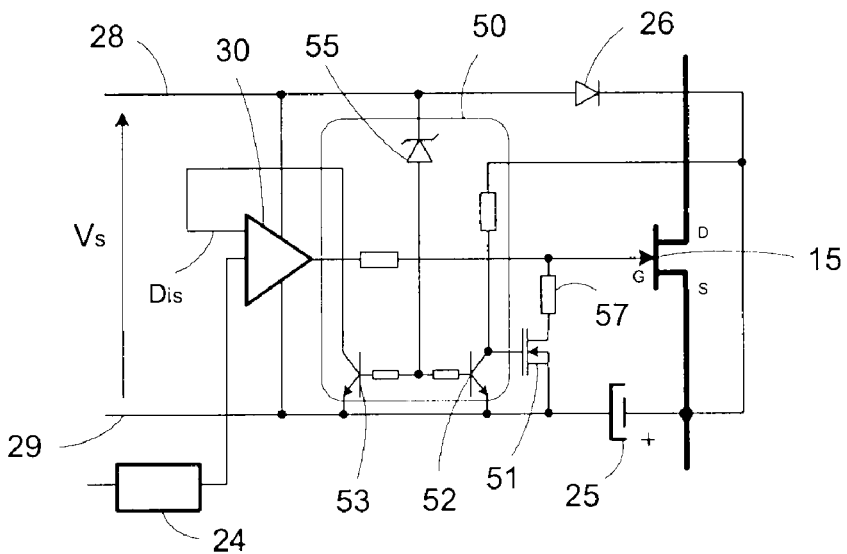
FIG. 6 shows a second embodiment of a device for controlling a JFET power switch according to the invention.
Figure 7:
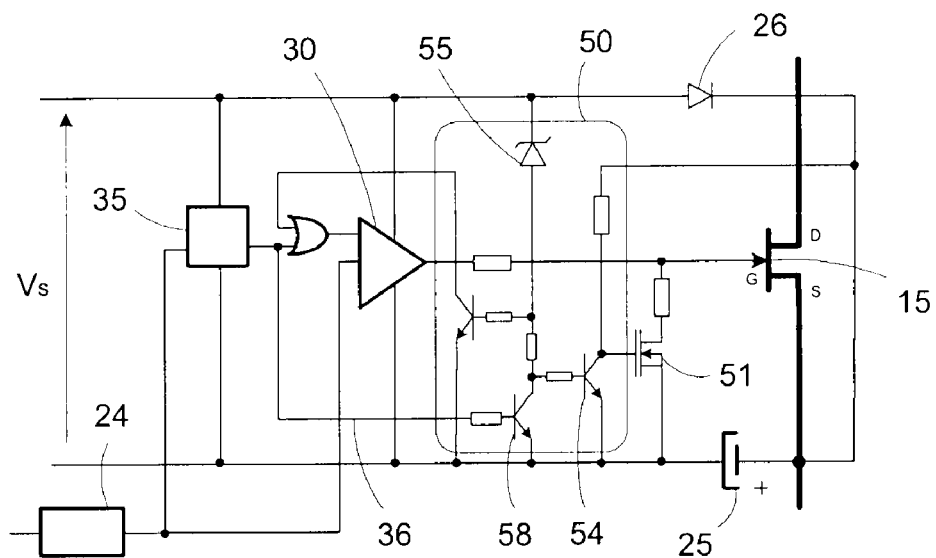
FIGS. 7 & 8 present variants of the second embodiment.
Figure 8:
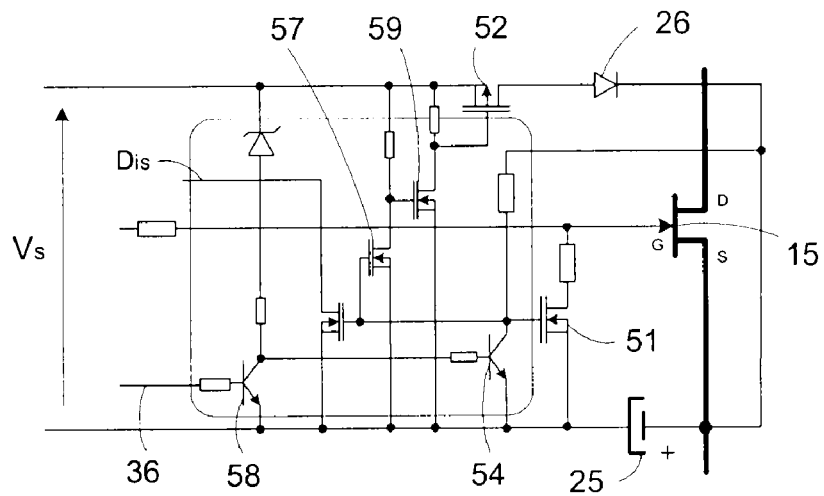

FIGS. 6 to 8 show several examples of a second embodiment of the invention in which the protection switching device is not an electromagnetic switch but comprises a first electronic switch 51. This electronic switch 51 is preferably an n-channel MOSFET transistor that has the advantage of generating very little leakage when it is in the ON state.

In FIG. 6, the device for controlling the JFET switch 15 is powered by a main power source and an auxiliary power source 25, in an identical manner to the device in FIG. 3 described hereinabove.

As in FIG. 3, the control device comprises a main gate control circuit 30 (or gate driver) allowing the gate g to be controlled, using a control signal 37 which comes for example from the control unit 24 of the speed controller. The output 39 of the main gate control circuit 30 is connected to the gate G of the JFET transistor 15 via a resistor.

The source of the MOSFET transistor 51 is connected to the negative terminal of the auxiliary capacitor 25. The Drain of the MOSFET transistor 51 is connected to the gate G of the JFET transistor 15 via a resistor 57. The Gate of the MOSFET transistor 51 is controlled by a control signal coming from the auxiliary control circuit 50. This auxiliary control circuit 50 may be formed with transistors using bipolar technology, as presented hereinbelow, or in an equivalent fashion using MOSFET technology.

FIG. 6 details a first example of the auxiliary control circuit 50 fulfilling the function for detecting an under-voltage in the voltage Vs. The auxiliary control circuit 50 comprises a bipolar transistor 54 whose collector is connected to the positive terminal of the auxiliary capacitor 25 via a resistor and to the gate of the MOSFET transistor 51, whose emitter is connected to the negative terminal of the auxiliary capacitor 25 and whose base is connected to the positive terminal 28 through a resistor and a Zener diode 55. The operation of the auxiliary control circuit 50 is as follows:

In normal operation, when the voltage Vs is present, the Zener diode 55 conducts and the transistor 54 is turned on. In this case, the collector of the transistor 54 is at 0 and the electronic switch 51 does not receive a control signal. The electronic switch 51 is therefore in a first non-conducting state or turned off. In this case, the gate G of the JFET transistor 15 is controlled only by the output 39 of the gate control circuit 30, because the gate G is not connected to the negative terminal of the capacitor 25.

As soon as the voltage Vs falls below the minimum trigger threshold determined by the Zener diode 55, the latter no longer conducts and the transistor 54 is turned off. In this case, the collector of the transistor 54 is returned to 1 since it is connected (via a resistor) to the positive terminal of the auxiliary capacitor 25. The electronic switch 51 then receives a control signal that makes it switch into a second conducting state. The gate G of the JFET transistor 15 is then connected directly to the negative terminal of the auxiliary capacitor 25, via the resistor 57.

Thus, when the electronic switch 51 is in the second conducting state, an auxiliary power supply circuit is advantageously created comprising the JFET transistor 15, the auxiliary capacitor 25, the electronic switch 51 and the resistor 57. The gate G of the JFET transistor 15 is then forced to a negative potential determined by the voltage $V_R$ across the terminals of the auxiliary capacitor 25, by short-circuiting the output 39 of the gate control circuit 30. Since the electronic switch 51 is a MOSFET transistor generating very little current in the conducting state, this solution also allows the losses of the auxiliary circuit to be minimized, and therefore a very long period T and/or a smaller size of the auxiliary capacitor 25 to be obtained. In the absence of power, the electronic switch 51 remains in the second conducting state.

However, if the gate control circuit 30 is in the high position (output 39 equal to Vs) when the electronic switch 51 is in the conducting state, the output 39 must be forced to 0, in order to avoid a current flowing between the output 39, the resistor 57 and the auxiliary capacitor 25. This is the reason why the auxiliary control circuit 50 also comprises another bipolar transistor 53 whose collector is connected to the input $D_{IS}$ of the gate control circuit 30, whose emitter is connected to the negative terminal of the auxiliary capacitor 25 and whose base is connected to the base of the transistor 54 via a resistor.

In normal operation, when the voltage Vs is present, the Zener diode 55 conducts, so the transistor 53 is on and the input $D_{IS}$ of the gate control circuit 30 is equal to 0. As soon as the Zener diode 55 no longer conducts, the bipolar transistor 53 turns off which forces the input $D_{IS}$ of the gate control circuit 30 into the 1 state so as to eliminate the voltage on the output 39.

FIG. 7 gives a second example of the auxiliary control circuit 50. In this second example, the function for detecting a short-circuit of the JFET transistor 15 is also processed. For this purpose, the control device comprises a short-circuit detection module 35 already previously described.

The auxiliary control circuit 50 additionally comprises a bipolar transistor 58 whose collector is connected to the base of the transistor 54, whose emitter is connected to the negative terminal of the auxiliary capacitor 25 and whose base is connected to the output 36 of the module 35. This output 36 is also sent to an OR logic gate where it is combined with the collector of the transistor 53. Thus, when the module 35 detects a short-circuit, its output 36 goes to the 1 state, which turns the transistor 58 on and the transistor 54 turns off. In this case, the electronic switch 51 switches into the second conducting state, and the gate G of the JFET transistor 15 is directly connected to the negative terminal of the auxiliary capacitor 25, via the resistor 57. Thus, a negative voltage is imposed between the gate G and the source S of the JFET transistor 15 when a short-circuit of the JFET transistor 15 is detected.

According to another variant of the second embodiment shown in FIG. 8, which is related to the variant in FIG. 5, the electronic switching device also comprises a second electronic switch 52 of the p-channel MOSFET transistor type, disposed between the positive terminal 28 and the diode 26 so as to disconnect the auxiliary power source 25 from the main power source when the first electronic switch 51 is positioned in the second conducting state. The operation is as follows:

In normal operation, the transistor 54 is on and the first switch 51 is turned off or non-conducting. Therefore, the transistor 57 is also turned off and the transistor 59 is conducting. In this case, the second electronic switch 52 in the conducting state and the positive terminals of the capacitors 21 and 25 are connected via the diode 26.

In contrast, in the case of a fault (for example via the Zener diode 55 or the transistor 58), the transistor 54 turns off which means that the first switch 51 is in the conducting state, since the collector of the transistor 54 is returned to 1. The transistor 57 also starts to conduct and the transistor 59 turns off. Therefore, the second electronic switch 52 then also turns off, which allows the positive terminal 28 to be isolated from the diode 26, and thus the auxiliary power source to be disconnected from the main power source. Possible leakage currents from the diode 26 when it is reverse-biased are avoided, which accordingly lengthens the period T during which the auxiliary capacitor 25 can maintain the JFET transistor 15 in the OFF state.

It goes without saying that, without straying from the scope of the invention, other variants and improvements in detail, and even the use of equivalent means, may be envisaged.

The invention claimed is:

1. A device for controlling a JFET power electronic switch of normally ON type, the control device comprising:
   a main gate control circuit powered by a main power source for driving the gate of the JFET switch;
   a protection switching device that is switchable between first and second positions;
   an auxiliary control circuit driving the protection switching device;
   an auxiliary power source that is supplied by the main power source, whose positive terminal is connected to the source of the JFET switch and whose negative terminal is connected to the gate of the JFET switch bypassing the main gate control circuit in the second position of the protection switching device,
   the auxiliary control circuit controlling the protection switching device such that when power from the main power source to the auxiliary control circuit falls below a threshold, the protection switching device is put in the second position.

2. The control device according to claim 1, wherein the JFET power electronic switch is made of silicon carbide.

3. The control device according to claim 1, wherein the auxiliary power source is an auxiliary capacitor connected to the main power source through a charging diode.

4. The control device according to claim 1, wherein the protection switching device comprises an electromagnetic switch including a contact mobile between the first and second positions by action of a control solenoid of the auxiliary control circuit, the mobile contact being switchable between the first position in which the gate of the JFET switch is connected to the main gate control circuit and the second position in which the gate of the JFET switch is connected to the negative terminal of the auxiliary power source.

5. The control device according to claim 4, wherein, in absence of power to the control solenoid, the mobile contact of the electromagnetic switch is held in the second position.

6. The control device according to claim 5, wherein when the power to the auxiliary control circuit falls below the threshold the control solenoid of the electromagnetic switch is not powered.

7. The control device according to claim 6, further comprising a device to detect a short-circuit in the JFET switch.

8. The control device according to claim 4, wherein the electromagnetic switch is a switch of MEMS type.

9. The control device according to claim 6, wherein the electromagnetic switch further comprises a second contact mobile between the first and second positions by action of the control solenoid, the second mobile contact being configured such that the auxiliary power source is disconnected from the main power source in the second position.

10. The control device according to claim 1, wherein the protection switching device comprises a first electronic switch placed between the gate of the JFET switch and the negative terminal of the auxiliary power source, and which is driven by the auxiliary control circuit between a first non-conducting state in which the gate of the JFET switch is not connected to the negative terminal of the auxiliary power source and a second conducting state in which the gate of the JFET switch is connected to the negative terminal of the auxiliary power source.

11. The control device according to claim 10, wherein in absence of a control signal coming from the auxiliary control circuit, the first electronic switch is positioned in the second conducting state.

12. The control device according to claim 11, wherein when the power to the auxiliary control circuits falls below the threshold, the auxiliary control circuit does not generate the control signal for the first electronic switch.

13. The control device according to claim 12, further comprising a device to detect a short-circuit of the JFET switch.

14. The control device according to claim 10, wherein the first electronic switch is a MOSFET transistor.

15. The control device according to claim 14, wherein the switching device comprises a second electronic switch of MOSFET transistor type, configured to disconnect the auxiliary power source from the main power source when the first electronic switch is positioned in the second conducting state.

16. A speed controller comprising:
   an inverter stage comprising plural JFET power electronic switches of normally ON type for supplying a variable voltage to an electrical load; and
   a control device according to claim 1 for each of the power electronic switches.

17. A device controlling a JFET power electronic switch of normally ON type, the control device comprising:
   a main gate control circuit powered by a main power source for driving the gate of the JFET switch;
   a protection switching device that is switchable between first and second positions;
   an auxiliary control circuit driving the protection switching device;
   an auxiliary power source that is supplied by the main power source, whose positive terminal is connected to the source of the JFET switch and whose negative terminal is connected to the gate of the JFET switch bypassing the main gate control circuit in the second position of the protection switching device,
   wherein the protection switching device comprises an electromagnetic switch including a contact mobile between two positions by action of a control solenoid of the auxiliary control auxiliary control circuit, the mobile contact being switchable between the first position in which the gate of the JFET switch is connected to the main gate control circuit and the second position in which the gate of the JFET switch is connected to the negative terminal of the auxiliary power source.

18. A device controlling a JFET power electronic switch of normally ON type, the control device comprising:
   a main gate control circuit powered by a main power source for driving the gate of the JFET switch;
   a protection switching device that is switchable between first and second positions;
   an auxiliary control circuit driving the protection switching device;
   an auxiliary power source that is supplied by the main power source, whose positive terminal is connected to the source of the JFET switch and whose negative terminal is connected to the gate of the JFET switch bypassing the main gate control circuit in the second position of the protection switching device,
   wherein the protection switching device comprises a first electronic switch placed between the gate of the JFET switch and the negative terminal of the auxiliary power source, and which is driven by the auxiliary control circuit between a first non-conducting state in which the gate of the JFET switch is not connected to the negative terminal of the auxiliary power source and a second conducting state in which the gate of the JFET switch is connected to the negative terminal of the auxiliary power source.

* * * * *